United States Patent [19]

Sugai

[11] Patent Number: 5,075,652
[45] Date of Patent: Dec. 24, 1991

[54] WIDE BAND SURFACE ACOUSTIC WAVE FILTER HAVING CONSTANT THICKNESS PIEZOELECTRIC LAYER AND DIVERGENT TRANSDUCERS

[75] Inventor: Kazuyoshi Sugai, Tokyo, Japan
[73] Assignee: Clarion Co., Ltd., Tokyo, Japan
[21] Appl. No.: 370,196
[22] Filed: Jun. 22, 1989
[51] Int. Cl.⁵ .............................................. H03H 9/64
[52] U.S. Cl. ................................ 333/193; 310/313 B; 310/313 A; 333/196
[58] Field of Search ............................ 333/193–196, 333/150–154; 310/313 R, 313 A, 313 B, 313 C, 313 D

[56] References Cited

U.S. PATENT DOCUMENTS

| | | | |
|---|---|---|---|
| 4,449,107 | 5/1984 | Asai et al. | 333/193 X |
| 4,480,209 | 10/1984 | Okamoto et al. | 310/313 B |
| 4,516,049 | 5/1985 | Mikoshiba et al. | 310/313 B X |
| 4,600,905 | 7/1986 | Fredricksen | 310/313 B X |
| 4,625,184 | 11/1986 | Niitsuma et al. | 333/193 X |

FOREIGN PATENT DOCUMENTS

| | | | |
|---|---|---|---|
| 180316 | 9/1985 | Japan | 333/196 |
| 2206256 | 12/1988 | United Kingdom | 333/193 |

Primary Examiner—Eugene R. LaRoche
Assistant Examiner—Benny Lee
Attorney, Agent, or Firm—Wallenstein, Wagner & Hattis, Ltd.

[57] ABSTRACT

In a wide band surface acoustic wave filter having a multilayered structure, in which an elastic substrate and a piezoelectric thin film are combined, transducers are so constructed that the period of electrodes thereof varies in the direction perpendicular to the propagation direction of the surface acoustic wave.

11 Claims, 8 Drawing Sheets

WIDE BAND SURFACE ACOUSTIC WAVE FILTER HAVING CONSTANT THICKNESS PIEZOELECTRIC LAYER AND DIVERGENT TRANSDUCERS

FIELD OF THE INVENTION

This invention relates to a wide band surface acoustic wave (hereinbelow abbreviated to SAW) filter, in which an input transducer and an output transducer are formed on a piezoacoustic body to filter the frequency.

BACKGROUND OF THE INVENTION

A wide band SAW filter using slanted transducer fingers has an advantage that the insertion loss is small, etc, with respect to a SAW filter using the apodizing method or dispersion type electrodes. However, on the other hand, it has a great disadvantage that the central pass band characteristics are adequately flat, but are generally inclined with frequency.

As a method for solving the problem, heretofore there have been proposed a method, by which corrections are effected in an external circuit, described in an article entitled "Wide-Band Linear Phase SAW Filter Design Using Slanted Transducer Fingers" IEEE Trans. on Sonics & Ultrasonics, SU-29, No. 6, pp 244–228, (July, 1982) by C. K. Campbell, et al., a method, by which corrections are effected by weighting a number of pairs of electrodes, described in an article entitled "Wide Band Surface Acoustic Wave Filter Using Slanted Transducer Fingers Weighting a Number of Pairs of Electrodes" Technical Reports of the Electronic Communication Society of Japan, U.S. 84-31 (September, 1984) by Yoshikawa, et al., These methods have a drawback that the pass band characteristics of the SAW filter are also similarly inclined in the frequency domain.

OBJECT OF THE INVENTION

The object of this invention is to provide a wide band SAW filter capable of correcting the inclination of the pass band characteristics due to the inherent property in the structure of the element.

SUMMARY OF THE INVENTION

In order to achieve the above object, a wide band SAW filter according to this invention is characterized in that it comprises a piezoelectric body formed on a semiconductor substrate and an input and an output transducer disposed on the piezoelectric body, the period of electrodes thereof varying in the direction perpendicular to the propagation direction of the SAW.

According to this invention, the drawback of this inclination in the pass band is removed by constructing an element having a multilayered structure. For a monocrystal substrate, the coupling coefficient has no wavelength dependence, but it is constant. On the contrary, for a multilayered structure the coupling coefficient has a wavelength dependence and thus it can be greater on the high frequency (short wavelength) side.

In this way, if the element is so designed that the coupling coefficient is greater on the high frequency side than on the low frequency side. The inclination in the pass band can be corrected.

DETAILED DESCRIPTION

Figure 1:
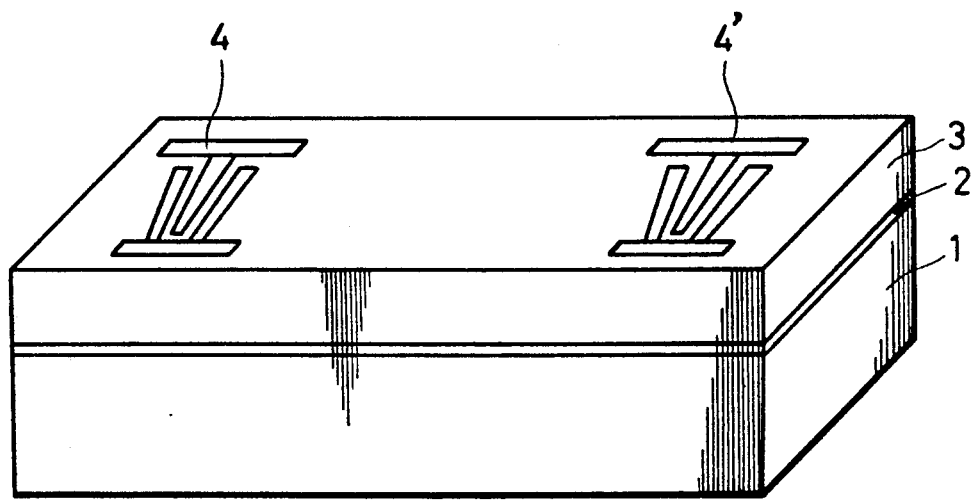
FIG. 1 is a perspective view of a wide band SAW filter according to this invention.
Figure 2A:
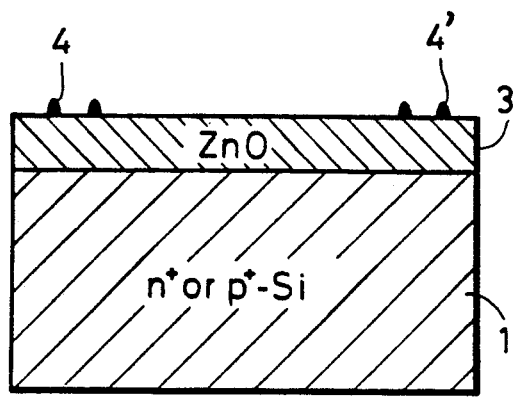
FIGS. 2A to 2J are cross-sectional views illustrating various structures for the device indicated in FIG. 1.
Figure 2B:
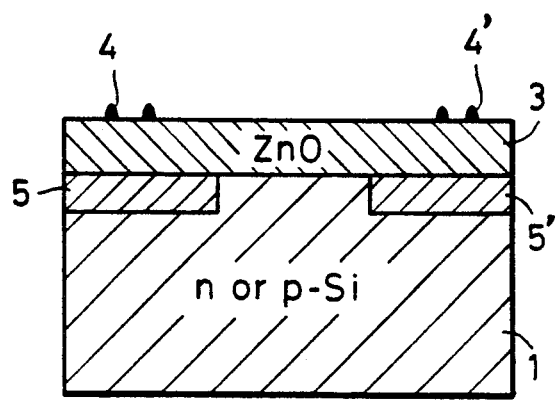
Figure 2C:
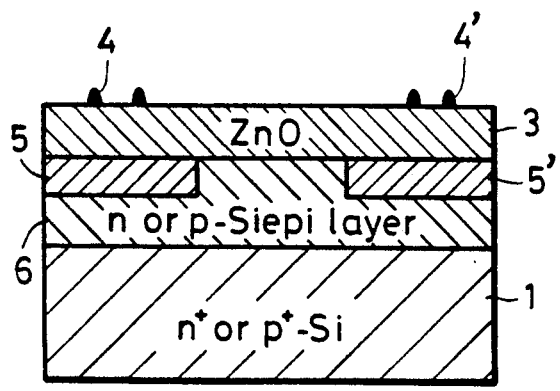
Figure 2D:
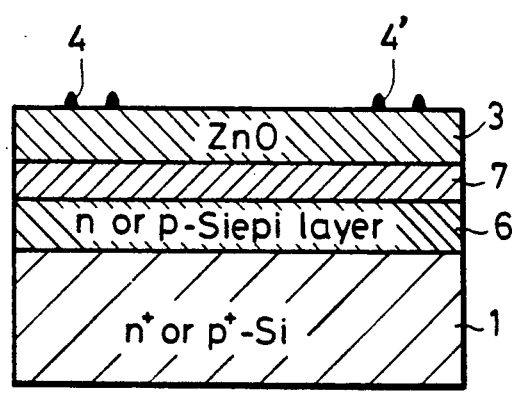
Figure 2E:
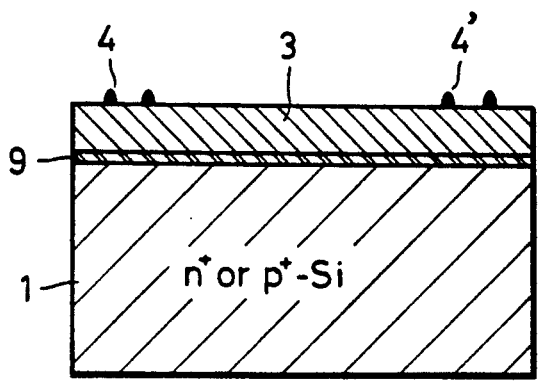
Figure 2F:
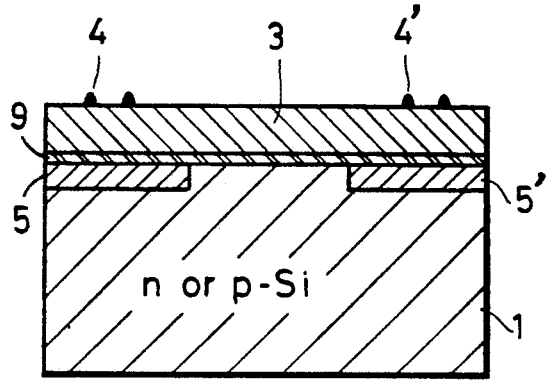
Figure 2G:
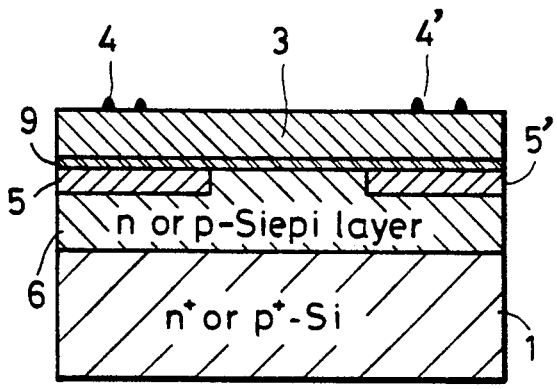
Figure 2H:
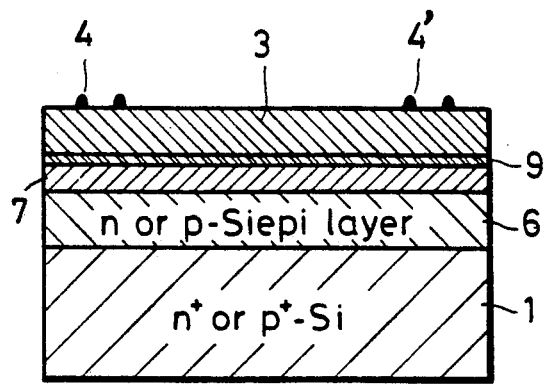
Figure 2I:
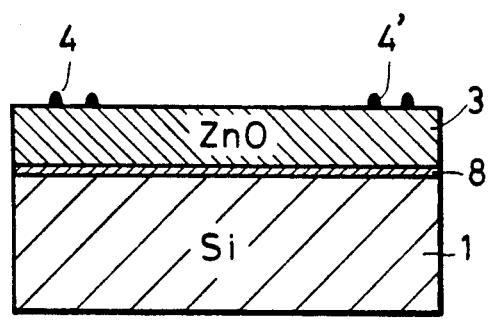

FIG. 1 is a perspective view of a wide band SAW filter according to this invention, in which reference numeral 1 is a silicon monocrystal substrate; 2 is a silicon oxide layer; 3 is a ZnO piezoelectric thin film; 4 and 4' are an input and an output slanted electrode finger transducer, respectively. This monocrystal substrate 1 has low resistivity regions doped with impurities at a high concentration at least under the input and the output transducer 4 and 4', respectively. The wide band SAW filter indicated in FIG. 1 has either one of the structures indicated in FIGS. 2A to 2J in the cross-section. In FIGS. 2A to 2J, 5 and 5' are $n^+$ or $p^+$ conductivity type diffusion regions; 6 is an n or p conductivity type silicon epitaxial layer; 7 is an $n^+$ or $p^+$ conductivity type diffusion layer; 8 is a metal layer or a diffusion region; and 9 is a silicon oxide layer. Thus, in more detail, FIG. 2A shows electrodes 4, 4' implaced on a piezoelectric layer 3 surmounting a heavily doped silicon substrate 1. FIG. 2B shows a related structure wherein the substrate 1 is of relatively lightly doped silicon, and on the surface of the substrate 1 below the electrodes 4, 4' there are respective local regions 5, 5' of high conductivity diffusion. FIG. 2C shows a structure similar to FIG. 2B; however, the lightly doped substrate 1 of FIG. 2B is replaced by a heavily doped substrate 1 having an upper epitaxial layer 6 grown thereon. FIG. 2D shows a structure similar to FIG. 2C, but showing the high conductivity diffusion region 7 as extending completely across joining the region under both electrodes 4, 4'. FIG. 2E shows a structure similar to FIG. 2A but including additional silicon oxide layer 9 interposed between the substrate 1 and the piezoelectric layer 3. FIG. 2F shows a structure similar to FIG. 2B, but further including an insulating layer 9 spanning across the entire upper surface of the thermal conductor substrate. FIG. 2G shows a structure similar to FIG. 2C, but again including an additional silicon oxide layer 9 extending across the upper surface of the semi-conductor substrate. FIG. 2H shows a structure similar to FIG. 2D, but again showing a similar silicon oxide layer spanning across the entire upper surface of the silicon substrate. FIG. 2I shows a structure similar to that shown in FIG. 2A, but having a metal film 8 interposed between the substrate 1 of the piezoelectric layer 3.

Figure 2J:
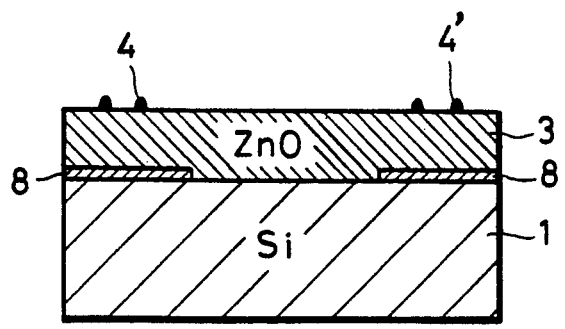

FIG. 2J shows a structure similar to FIG. 2I, but having the metallic layer 8 localized to regions immediately below the electrodes 4, 4′.

Figure 3:
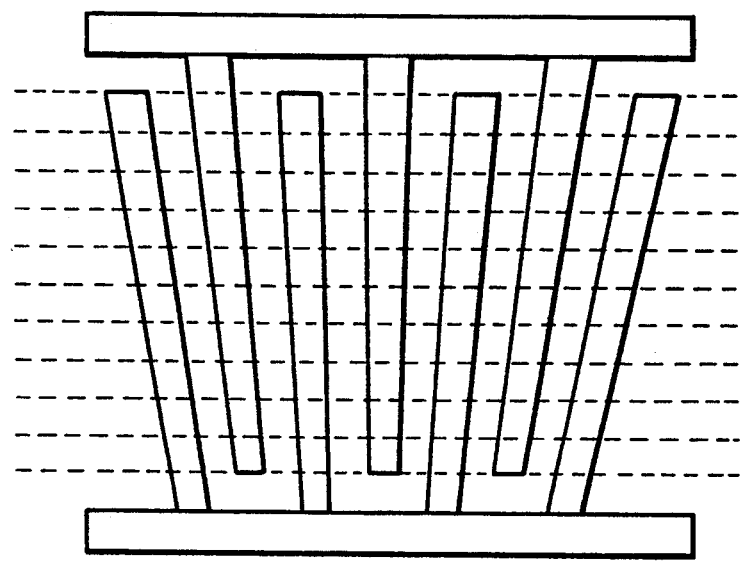
FIG. 3 is a plan view of a slanted electrode finger transducer.

FIG. 3 is a top view of an input or output transducer in an enlarged scale, whose electrode pitch (length of the period of electrodes, i.e., centerline-to-centerline electrode separation) varies in the direction perpendicular to the propagation direction of the SAW.

When the slanted electrode fingers are divided into several channels by broken lines parallel to the propagation direction as indicated in FIG. 3, they can be considered as normal type. In this embodiment, they are divided in such a manner that the inter-finger spaces along a given channel are generally equal to each other.

Figure 4:
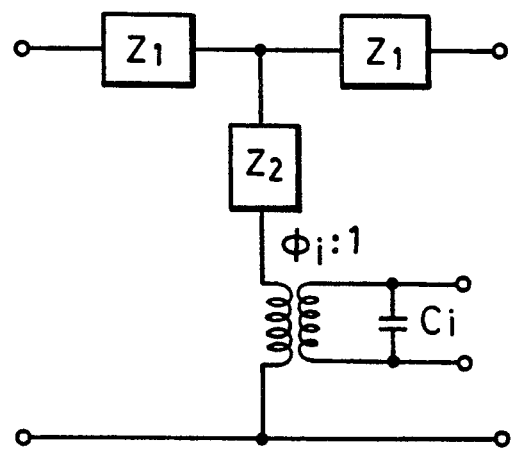
FIG. 4 is an equivalent circuit diagram showing a ½ pair of an i-th channel.

The equivalent circuit diagram of a ½ pair of the i-th channel can be expressed as indicated in FIG. 4.

$$Z_1 = jZ_0 \tan \frac{\theta_i}{4} \quad (1)$$

$$Z_2 = -jZ_0 \csc \frac{\theta_i}{2} \quad (2)$$

$$\theta_i = 2\pi f_i L_i / v_i \quad (3)$$

$$\phi_i \approx \pm \sqrt{2 f_i k_i^2 C_i Z_0} \left(\frac{f_i}{f_i}\right)^{\frac{1}{2}} \quad (4)$$

where
$Z_0$: acoustic impedance,
$f_i$: central frequency of the i-th channel,
$k_i^2$: coupling coefficient of the i-th channel,
$C_i$: braking capacity of a ½ pair,
$f_l$: central frequency of the channel having the longest electrode pitch,
$L_i$: electrode pitch of the i-th channel, and
$v_i$: sound velocity in the i-th channel.

$\phi_i$ represents a winding ratio of an ideal transformer in the equivalent circuit diagram indicated in FIG. 4 and it can be considered that it represents a transformation ratio from an electric part to an acoustic port.

$\theta_i$ is a dummy variable defined in terms of the frequency $f_i$, $L_i$, and $v_i$.

In the case where a monocrystal substrate such as a Ycut-Zprop LiNbO₃ substrate is used as by the prior art technique, the coupling coefficient of the i-th channel can be expressed by;

$$k_i^2 = k_{bulk}^2 \quad (5)$$

Equation (4) can be transformed into $$\phi_i \approx \phi_{io} (f_l/f_i)^{\frac{1}{2}} \quad (6)$$

where $\phi_{io}$ indicates the winding ratio of the normal type and $k_{bulk}^2$ represents the effective coupling coefficient, which the monocrystal substrate has.

It can be understood from Equation (6) that the transformation ratio is greater on the high frequency side than on the low frequency side and that the previously mentioned inclination appears within the pass band.

In a multilayered structure, as understood from Equation (4), the transformation ratio $\phi_i$ can be expressed by;

$$\phi_i \alpha (k_i^2)^{\frac{1}{2}} (1/f_i)^{\frac{1}{2}} \quad (7)$$

If the coupling coefficient is greater on the high frequency side than on the low frequency side, it is possible to make $\phi_i$ almost uniform with respect to the frequency.

This is the principle for correcting the passband inclination.

In order to realize a wide band filter, it is necessary to use a material having a high coupling coefficient, with which it is possible to lower the insertion loss. In order to obtain a high coupling coefficient using a multilayered structure in which a piezoelectric thin film is used, a structure in which a ZnO thin film is formed on an Si monocrystal substrate, and for which the propagation mode of the SAW is in the Sezawa wave mode.

Figure 5:
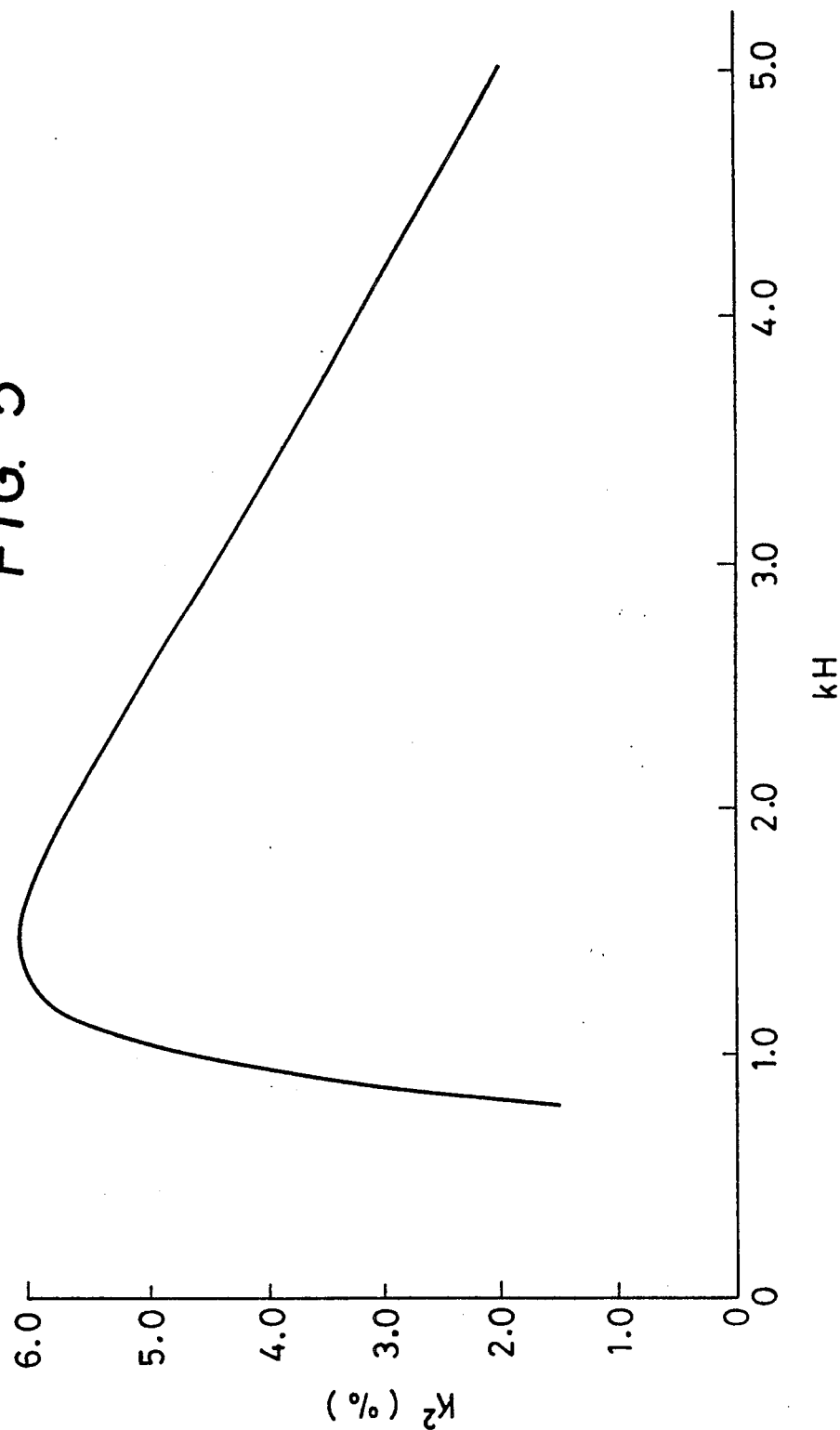
FIG. 5 is a graph showing the relation between the product of the wave number k of the SAW by the thickness of a ZnO layer and the effective coupling coefficient.

FIG. 5 shows a plot of the product of the wave number k and the thickness H of the ZnO layer versus the effective coupling coefficient $K^2$ in a transducer having this structure. At this time, attention is paid to the region, where kH is smaller than 1.5. The layer thickness H being constant, the coupling coefficient decreases with increasing wavelength, i.e. with decreasing wave number k. On the contrary, the coupling coefficient increases with decreasing wavelength, i.e. with increasing wave number k. In this way, for a given layer thickness, it possible to correct the inclination within the pass band of the wide band filter using slanted electrode finger transducers by setting a working point in a region where the coupling coefficient increases monotonically with respect to the wave number so that the coupling coefficient is greater on the high frequency side than on the low frequency side.

Figure 6:
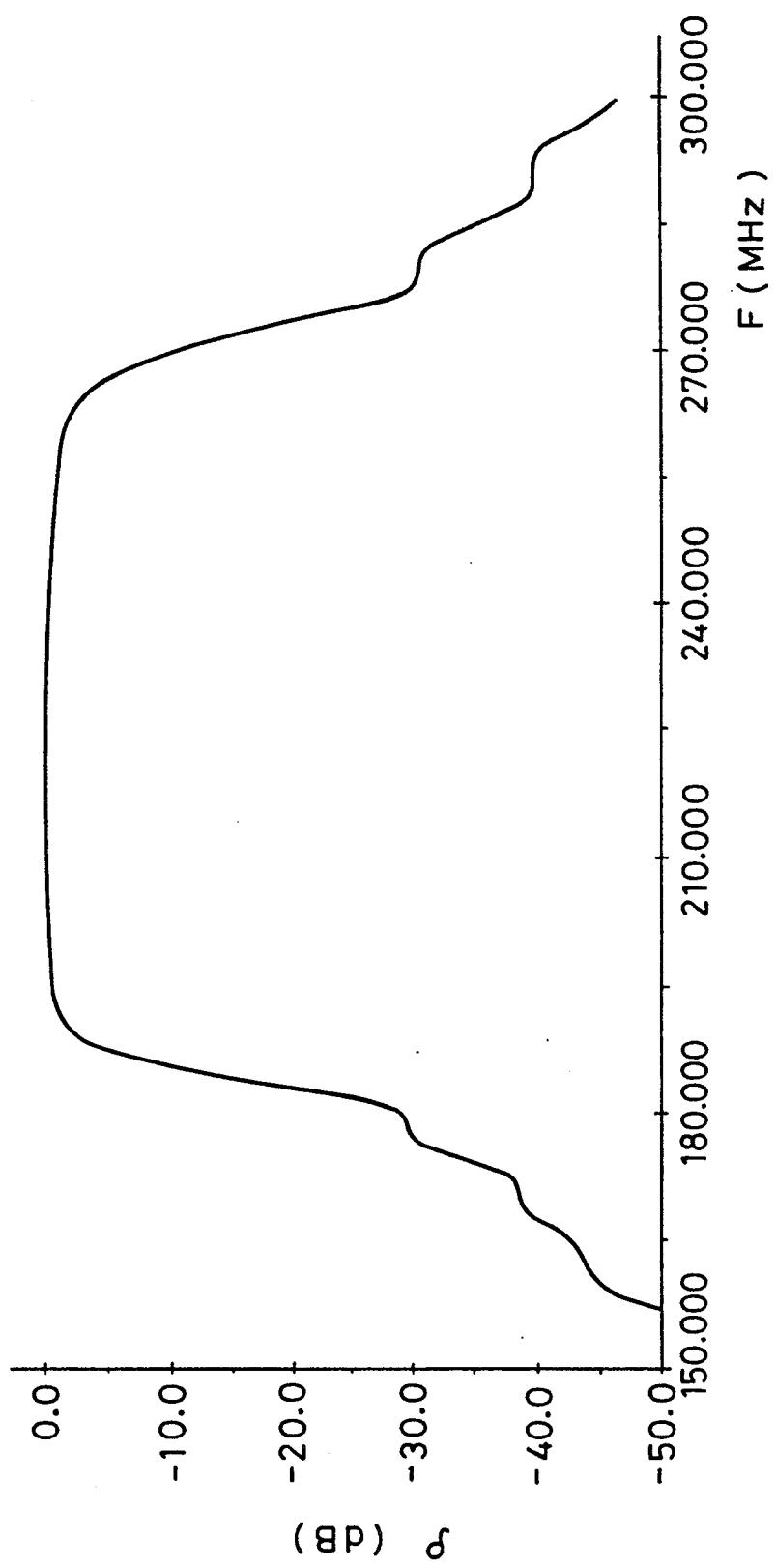
FIG. 6 is a graph showing passband characteristics of the inventive filter.

FIG. 6 shows a filter characteristic curve, according to this embodiment, in which f represents the frequency and P indicates the insertion loss.

A representative transducer is a transducer having slanted electrode fingers, in which the smallest electrode period (corresponding to the wavelength of the SAW) is 20 μm and the greatest is 30 μm. The substrate is a (110) cut Si substrate, on which an oxide layer about 100 μm thick is formed by thermal oxidation. A ZnO piezoelectric thin film 4.5 μm thick is deposited further thereon. The propagation direction of the SAW is Si [100].

The electrodes are made of Al on the ZnO piezoelectric thin film. In this embodiment, the Si substrate is a p⁺ — Si doped with boron at a high concentration. The greatest opening length of the transducer is 2 mm; the number of pairs is 20 both for the input and for the output; and the distance between the two transducers is 10 mm.

The working region of this wide band filter is a region, where kH is comprised between 0.94 and 1.41 in FIG. 5. The central frequency is 225 MHz and the bandwidth is 75 MHz (the relative band width is greater than 30%). In this way, it is possible to obtain a good wide band pass filter having an almost flat pass characteristic curve within the pass band.

In this embodiment, since a SAW of Sezawa mode is used, excellent wide band characteristics can be obtained, keeping a low loss, owing to the magnitude of the coupling coefficient therefor.

In the design of this element, a structure having a great coupling coefficient has been adopted for reducing the insertion loss and in this way attention has been paid to the lowering of the loss. However, for a filter using slanted electrodes, it is necessary to pay attention also to beam steering. It is a matter of course that by the slanted electrode fingers the propagation direction of the excited SAW has a certain angle with respect to the propagation axis and the insertion loss of the filter is great because of the beam steering. In this embodiment, in order to minimize the loss due to the beam steering, for the Si substrate the (110) cut crystallographical face is used and the [100] direction is selected as the direction of the propagation axis.

Figure 7:
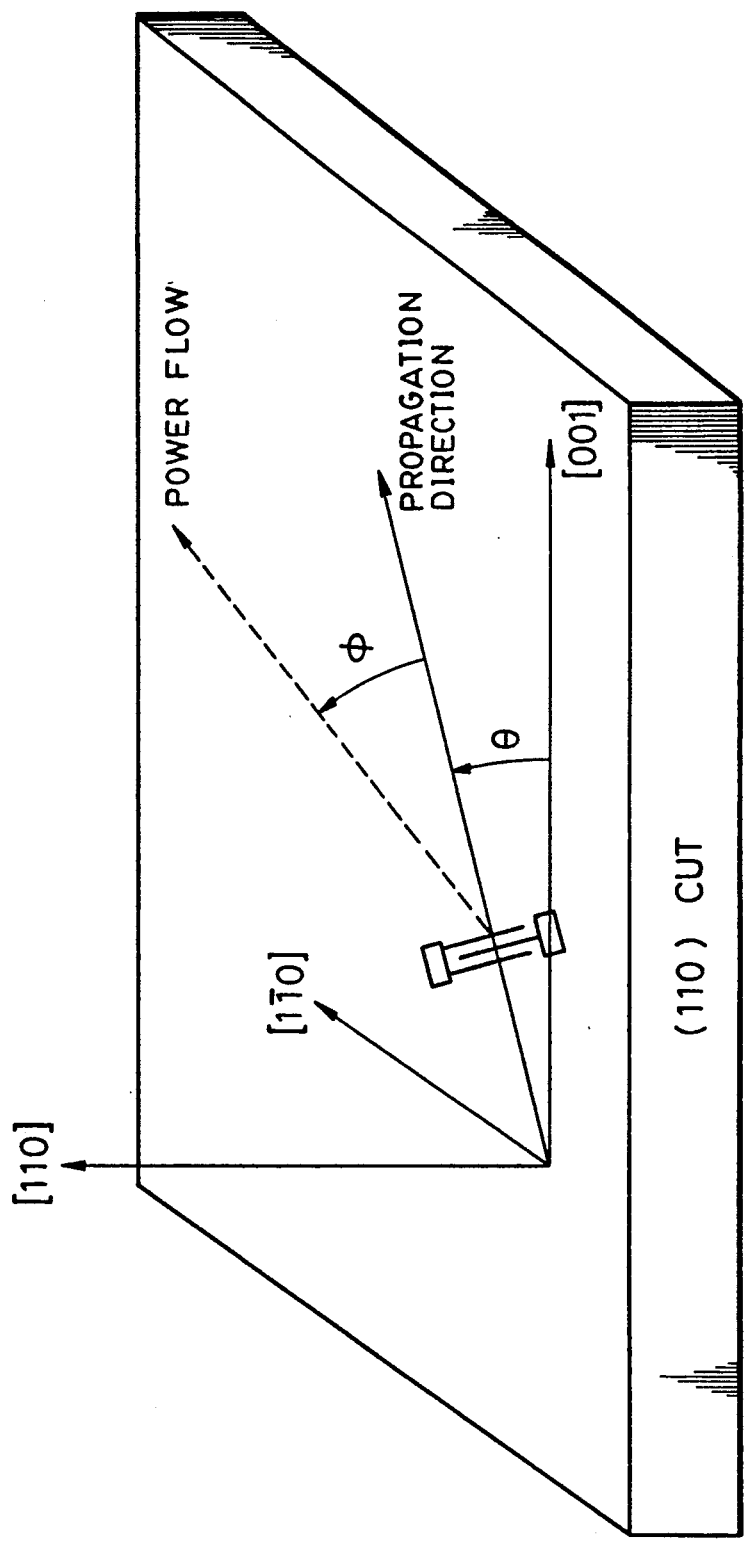
FIG. 7 is a scheme for explaining beam steering of surface acoustically waves.

Each of the electrode fingers in the slanted electrode finger transducer has a certain angle with respect to the [001] direction of the propagation axis. The angle between this propagation axis [001] and the direction perpendicular to the relevant electrode finger (propagation direction) being represented by $\theta$, the traveling direction of the power flow of the SAW excited by the electrode finger having the angle $\theta$ and the propagation direction is represented by $\phi$ (power flow angle) (cf. FIG. 7).

Figure 8A:
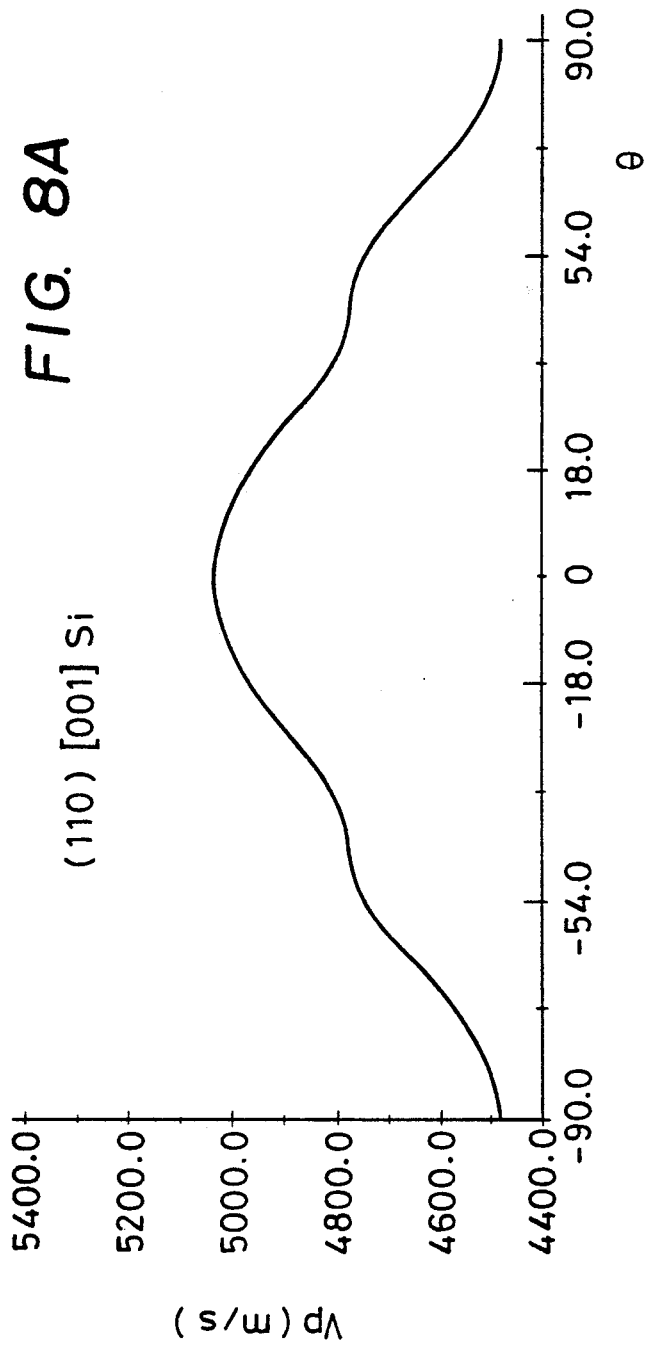
FIGS. 8A and 8B are graphs showing the relation between the phase velocity and the power flow angle versus the propagation direction of surface acoustical waves, respectively.
Figure 8B:
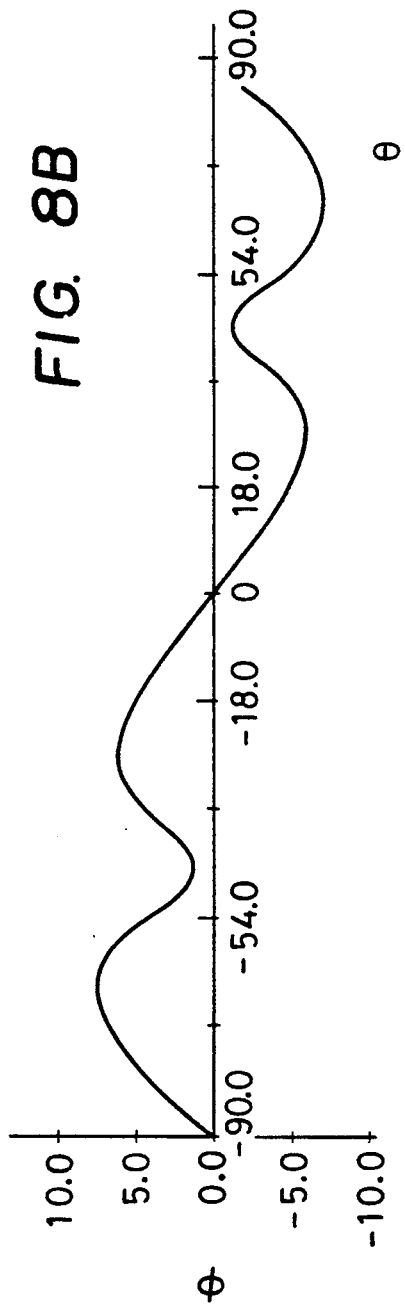

The phase velocity $V_p$ (see FIG. 8A) and the power flow angle $\phi$ for Si (110) cut and the [100] propagation direction used in this embodiment have relations with respect to the propagation direction $\theta$ indicated in FIGS. 8A and 8B, respectively. Paying attention to the power flow angle $\phi$ at the proximity of $\theta = 0$ in FIG. 8B, $\phi$ is positive in the negative direction of $\theta$ and on the other hand $\phi$ is negative in the positive direction of $\theta$. This relation acts so that the beam steering returns the power flow towards the [001] propagation axis, even if the propagation direction has a certain angle with respect to the [001] propagation axis. This is an excellent property, which the Si(110) cut substrate has. In particular, in the case where slanted electrode finger transducers are used, this has an action to reduce the insertion loss of the filter.

As explained above, according to this invention, it is possible to obtain a wide band SAW filter capable of correcting the inclination of pass band characteristics due to the inherent property in the element structure.

What is claimed is:

1. A wide band surface acoustic wave filter comprising:
   a semiconductor substrate having a given outer surface;
   a piezoelectric layer of given thickness formed on said outer surface of said semiconductor substrate; and
   an input and an output transducer disposed on an outer surface of said piezoelectric layer and being characterized by coupling coefficients thereto, said input transducer when excited generating surface acoustical waves propagating in a direction of propagation along a path, said output transducer being disposed to be in said path, each said transducer having associated therewith at least three interdigitated electrodes configured as a spatially periodic array having periodic inter-electrode spacings and oriented generally perpendicular to said direction of propagation, the inter-electrode spacing between each adjacent pair of said interdigitated electrodes increasing from a minimum to a maximum spacing value along a direction perpendicular to said propagation direction, the thickness of said piezoelectric layer being of substantially constant value under said interdigitated electrodes, the thickness of said piezoelectric layer and said minimum spacing value being such that the coupling coefficient of said transducers decreases from an upper frequency corresponding to said minimum spacing value to a lower frequency corresponding to said maximum spacing value.

2. A wide band surface acoustic wave filter comprising:
   a semiconductor substrate having a given outer surface;
   an insulating layer formed on said outer surface;
   a piezoelectric layer of given thickness formed on said insulating layer; and
   an input and an output transducer disposed on an outer surface of said piezoelectric layer and being characterized by coupling coefficients thereto, said input transducer when excited generating surface acoustical waves propagating in a direction of propagation along a path, said output transducer being disposed to be in said path, each said transducer having associated therewith at least three interdigitated electrodes configured as a spatially periodic array having periodic inter-electrode spacings and oriented generally perpendicular to said direction of propagation, the inter-electrode spacing between each adjacent pair of said interdigitated electrodes increasing from a minimum to a maximum spacing value along a direction perpendicular to said propagation direction, the thickness of said piezoelectric layer being of substantially constant value under said interdigitated electrodes, the thickness of said piezoelectric layer and said minimum spacing value being such that the coupling coefficient of said transducers decreases from an upper frequency corresponding to said minimum spacing value to a lower frequency corresponding to said maximum spacing value.

3. A wide band surface acoustic wave filter according to claim 1 or 2 wherein regions of said outer surface of said semi-conductor substrate are high impurity concentration regions extending at least under said transducers.

4. A wide band surface acoustic wave filter according to claim 1 or 2 wherein said semiconductor substrate is monocrystalline silicon having axes and faces characterized by Miller indices defining a (110) cut face and a [100] direction; the crystallographical surface confronting said piezoelectric layer is approximately equivalent to said (110) cut face; and said transducers are oriented so that the propagation direction of the surface acoustic wave is approximately equivalent to said [100] direction.

5. A wide band surface acoustic wave filter according to claim 1 or 2 wherein said piezoelectric layer is made of zinc oxide of given thickness H and fulfills the condition that $kH < 1.5$ where $k$ is $2\pi$ divided by the minimum inter-electrode spacing of said transducers.

6. A wide band surface acoustic wave filter according to claim 1 including at least one metallic thin film disposed on said outer surface of said semi-conductor substrate and extending at least under said transducers.

7. A wide band surface acoustic wave filter according to claim 2 including at least one metallic thin film disposed on the surface of said insulating layer to abut said piezoelectric layer and extending at least under said transducers.

8. A wide band surface acoustic wave filter comprising:
   a wave propagation medium formed as a piezoelectric layer of given thickness affixed to a given surface of a substrate, and
   an input transducer and an output transducer for producing and receiving surface acoustical waves respectively, both of said transducers being disposed on said piezoelectric layer to be coupled thereto, each having a plurality of stripe-shaped interdigitated electrodes with spaces therebetween and connected to associated first and second terminal electrodes and disposed so that the spacing between adjacent stripes varies progressively from a given minimum spacing in regions proximate to said first terminal electrode to a given maximum spacing in regions proximate to said second terminal electrode, said minimum and maximum spacings establishing given passband upper and lower frequencies respectively, said propagation medium having the property that the coupling between said transducers and said wave propagation medium varies with frequency so as to have a maximum coupling value at a given frequency, said given frequency varying according to said given thickness of said piezoelectric layer, the thickness of said piezoelectric layer being of substantially constant value under said interdigitated electrodes, said minimum spacing and said given thickness of said piezoelectric layer having respective values placing said passband upper frequency generally no higher than said given frequency.

9. The surface acoustic wave filter of claim 8 wherein the stripe-shaped electrodes associated with each of said terminal electrodes are of generally equal length.

10. The surface acoustical wave filter of claims 8 or 9 including at least one metallic thin film disposed on said surface of said substrate and extending at least under said transducers.

11. The surface acoustical wave filter of claims 8 or 9 wherein each said plurality of electrodes comprises at least two stripe-shaped electrodes disposed to diverge away from each other as they extend away from their associated terminal electrode and at least one additional stripe-shaped electrode extending from its associated terminal electrode and disposed in an interdigitated fashion in the spaces between said interconnected electrodes, said at least two stripe-shaped electrodes being configured so that the spacing between adjacent electrodes increases along the direction of divergence of said interconnected electrodes.

* * * * *

UNITED STATES PATENT AND TRADEMARK OFFICE
CERTIFICATE OF CORRECTION

PATENT NO. : 5,075,652
DATED : December 24, 1991
INVENTOR(S) : Kazuyoshi Sugai

It is certified that error appears in the above-identified patent and that said Letters Patent is hereby corrected as shown below:

On the title page:

Immediately below the line reading:

[22]  Filed: June 22, 1989    insert

[30]  Foreign Application Priority Data
      July 5, 1988 [JP]  Japan.....63-1677596

Signed and Sealed this

Sixth Day of April, 1993

Attest:

STEPHEN G. KUNIN

*Attesting Officer*    Acting Commissioner of Patents and Trademarks

UNITED STATES PATENT AND TRADEMARK OFFICE
CERTIFICATE OF CORRECTION

PATENT NO. : 5,075,652

DATED : December 24, 1991

INVENTOR(S) : Kazuyoshi Sugai

It is certified that error appears in the above-identified patent and that said Letters Patent is hereby corrected as shown below:

ON THE TITLE PAGE:

[22] Filed: June 22, 1989 insert

[30] Foreign Application Priority Data
July 5, 1988 [JP] Japan.....63-167596

This certificate supersedes the Certificate of Correction issued on April 6, 1993.

Signed and Sealed this

Fifth Day of April, 1994

Attest:

Attesting Officer

BRUCE LEHMAN

Commissioner of Patents and Trademarks